United States Patent
Chang et al.

(10) Patent No.: US 9,466,392 B2
(45) Date of Patent: Oct. 11, 2016

(54) MEMORY ARRAY WITH MEMORY CELLS ARRANGED IN PAGES

(71) Applicant: eMemory Technology Inc., Hsin-Chu (TW)

(72) Inventors: Wei-Chen Chang, Kaohsiung (TW); Wen-Hao Ching, Hsinchu County (TW); Chih-Hsin Chen, Changhua County (TW); Shih-Chen Wang, Taipei (TW); Ching-Sung Yang, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 14/881,177

(22) Filed: Oct. 13, 2015

(65) Prior Publication Data
US 2016/0104537 A1  Apr. 14, 2016

Related U.S. Application Data

(60) Provisional application No. 62/063,410, filed on Oct. 14, 2014.

(51) Int. Cl.
| | |
|---|---|
| *G11C 16/04* | (2006.01) |
| *G11C 17/18* | (2006.01) |
| *G11C 16/14* | (2006.01) |
| *G11C 17/16* | (2006.01) |

(Continued)

(52) U.S. Cl.
CPC ........... *G11C 17/18* (2013.01); *G11C 16/0408* (2013.01); *G11C 16/14* (2013.01); *G11C 17/16* (2013.01); *H01L 23/5256* (2013.01); *H01L 27/10897* (2013.01); *H01L 27/1116* (2013.01); *H01L 27/1156* (2013.01); *H01L 27/11206* (2013.01); *H01L 27/11524* (2013.01); *H01L 29/0649* (2013.01); *H01L 29/1033* (2013.01); *H01L 29/78* (2013.01); *H01L 29/868* (2013.01); *H01L 29/8611* (2013.01); *G11C 29/785* (2013.01)

(58) Field of Classification Search
CPC ... G11C 17/18; G11C 16/14; G11C 16/0408; G11C 17/16; G11C 27/11524; H01L 27/1156; H01L 27/11524; H01L 27/10897; H01L 27/1116; H01L 27/11206; H01L 23/5256; H01L 29/0649; H01L 29/78; H01L 29/8611; H01L 29/868
See application file for complete search history.

(56) References Cited

U.S. PATENT DOCUMENTS

| | | |
|---|---|---|
| 6,728,139 B2 | 4/2004 | Masuoka |
| 7,263,001 B2 | 8/2007 | Wang |
| 7,663,916 B2 | 2/2010 | Chih |
| 7,839,683 B2 | 11/2010 | Oka |

(Continued)

*Primary Examiner* — Toan Le
(74) *Attorney, Agent, or Firm* — Winston Hsu; Scott Margo (57) ABSTRACT

A memory array includes a first memory page and a second memory page. The first memory page includes a first word line, a first select gate line, a first control line, a first erase line, and a plurality of first memory cells each coupled to the first word line, the first select gate line, the first control line, and the first erase line, and for receiving a bit line signal and a source line signal. The second memory page includes a second control line, a second erase line, and a plurality of second memory cells each coupled to the first word line, the first select gate line, the second control line, and the second erase line, and for receiving a bit line signal and a source line signal.

15 Claims, 8 Drawing Sheets

(51) Int. Cl.
*H01L 27/115* (2006.01)
*H01L 29/10* (2006.01)
*H01L 23/525* (2006.01)
*H01L 27/108* (2006.01)
*H01L 27/11* (2006.01)
*H01L 27/112* (2006.01)
*H01L 29/06* (2006.01)
*H01L 29/78* (2006.01)
*H01L 29/861* (2006.01)
*H01L 29/868* (2006.01)
*G11C 29/00* (2006.01)

(56) References Cited

U.S. PATENT DOCUMENTS

| | | | |
|---|---|---|---|
| 7,968,926 B2 * | 6/2011 | Huang | G11C 16/0441 257/300 |
| 8,284,600 B1 | 10/2012 | Poplevine | |
| 8,325,524 B2 | 12/2012 | Oka | |
| 8,958,245 B2 | 2/2015 | Hsu | |
| 2008/0251832 A1 * | 10/2008 | Chih | G11C 16/0433 257/315 |
| 2012/0236646 A1 * | 9/2012 | Hsu | G11C 16/0441 365/185.14 |
| 2013/0223148 A1 * | 8/2013 | Seo | H01L 27/04 365/185.11 |

* cited by examiner

MEMORY ARRAY WITH MEMORY CELLS ARRANGED IN PAGES

CROSS REFERENCE TO RELATED APPLICATIONS

This non-provisional application claims priority of U.S. provisional application No. 62/063,410, filed on Oct. 14, 2014, included herein by reference in its entirety.

BACKGROUND OF THE INVENTION

1. Field of the Invention

The present invention relates to a nonvolatile memory array, and more particularly, to a nonvolatile memory array with memory cells arranged in pages.

2. Description of the Prior Art

An electrically rewritable nonvolatile memory is a type of memory that retains information it stores even when no power is supplied to memory blocks and allows on-board rewriting of a program. Due to the wide range of applications for various uses, there is a growing need for a nonvolatile memory to be embedded in the same chip with the main circuit, especially for personal electronic devices having strict requirement for circuit area.

An example of a nonvolatile memory cell is a memory cell comprising two or three transistors, which are memory transistors for retaining data, and one or two select transistor for selecting a memory transistor as a so-called memory bit. Also, the memory bit maybe arranged in different pages, that is, within different words, for flexible access. In this case, the nonvolatile memory cell may include two select transistors for further control.

Typically, the memory transistor has a floating gate. The floating gate is able to hold electrons during a programming operation of a memory cell. When erasing data in the memory cell, an FN (Fowler Nordheim) tunnel current is induced and flows via a tunnel under the floating gate, causing the emission of electrons from the floating gate.

However, to operate memory cells disposed in different pages may require complicated control signals on different signal lines, making the operations of the nonvolatile memory inflexible and requiring a significant amount of space for line connections.

SUMMARY OF THE INVENTION

One embodiment of the present invention discloses a memory array. The memory array includes a memory page. The memory page includes a first word line, a first select gate line, a first control line, a first erase line, and a plurality of first memory cells. The first word line is for receiving a first word line signal, and the first select gate line is for receiving a first select gate signal. The first control line is for receiving a first control line signal, and the first erase line is for receiving a first erase line signal. Each of first memory cells includes a word line node coupled to the first word line, a select gate coupled to the first select gate line, a control node coupled to the first control line, an erase node coupled to the first erase line, a bit line node for receiving a bit line signal, and a source line node for receiving a source line signal.

The bit line nodes of the plurality of first memory cells are for receiving different bit line signals, and the source line nodes of the plurality of first memory cells are for receiving different source line signals.

During an program operation of a selected first memory cell of the plurality of first memory cells, a bit line signal received by the selected first memory cell and a bit line signal received by an unselected first memory cell are at different voltages, and a source line signal received by the selected first memory cell and a source line signal received by the unselected first memory cell are at different voltages.

Another embodiment of the present invention discloses a memory array. The memory array includes a first memory page and a second memory page. The first memory page includes a first word line for receiving a first word line signal, a first select gate line for receiving a first select gate signal, a first control line for receiving a first control line signal, a first erase line for receiving a first erase line signal, and a plurality of first memory cells. Each of the first memory cells is coupled to the first word line, the first select gate line, the first control line, and the first erase line, and receives a bit line signal and a source line signal.

The second memory page includes a second control line for receiving a second control line signal, a second erase line for receiving a second erase line signal, and a plurality of second memory cells. Each of the second memory cells is coupled to the first word line, the first select gate line, the second control line, and the second erase line, and receives a bit line signal and a source line signal.

Another embodiment of the present invention discloses a memory array. The memory array includes a first memory page and a second memory page. The first memory page includes a first word line for receiving a first word line signal, a first select gate line for receiving a first select gate signal, a first control line for receiving a first control line signal, a first erase line for receiving a first erase line signal, and a plurality of first memory cells. Each of the first memory cells is coupled to the first word line, the first select gate line, the first control line, and the first erase line, and receives a bit line signal and a source line signal.

The second memory page includes a second word line for receiving a second word line signal, a second select gate line for receiving a second select gate signal, a second control line for receiving a second control line signal, a second erase line for receiving a second erase line signal, and a plurality of second memory cells. Each of the second memory cells is coupled to the second word line, the second select gate line, the second control line, the second erase line, a bit line node of a corresponding first memory cell in the first memory page, and a source line node of the corresponding first memory cell in the first memory page.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
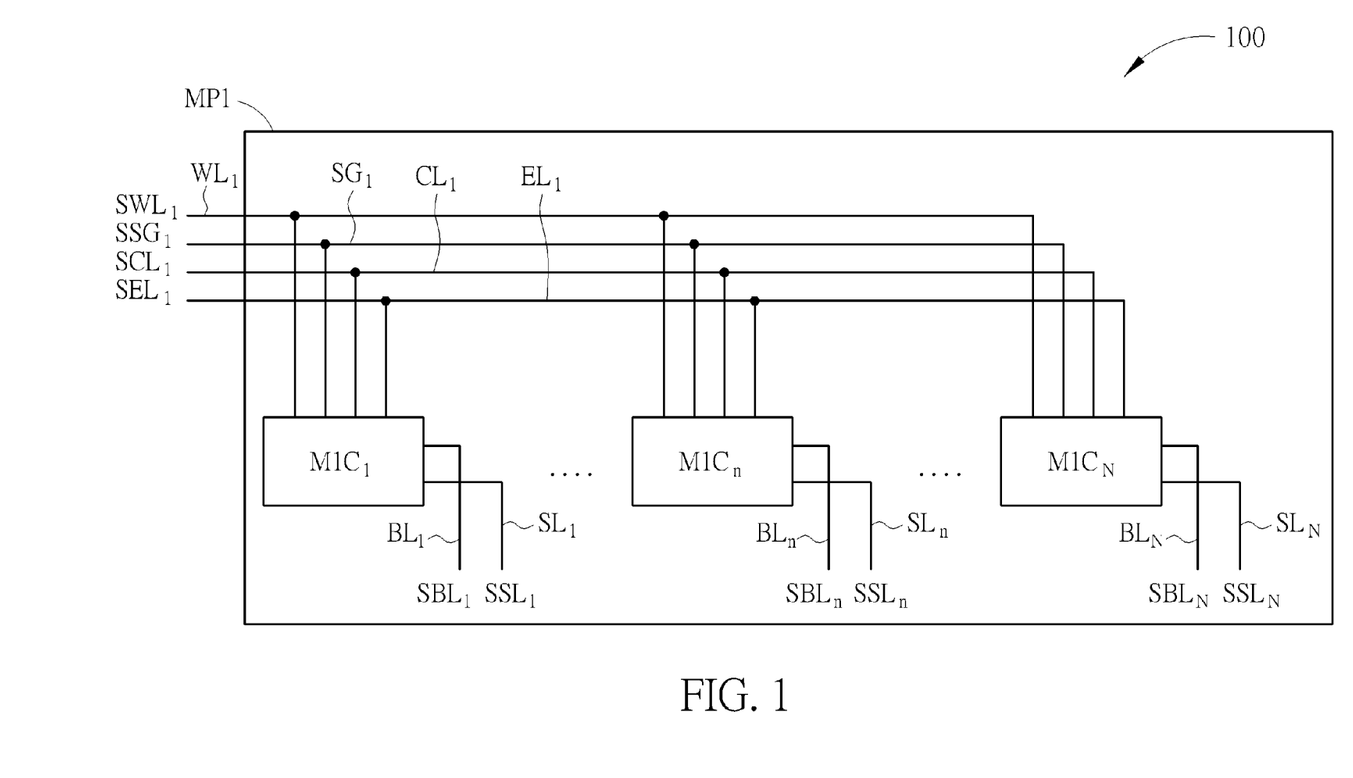
FIG. 1 shows a memory array according to one embodiment of the present invention.

FIG. 1 shows a memory array 100 according to one embodiment of the present invention. The memory array 100 includes a first memory page MP1. The first memory page MP1 includes a first word line $WL_1$, a first select gate line $SG_1$, a first control line $CL_1$, a first erase line $EL_1$, and N first memory cells $M1C_1$ to $M1C_N$, where N is a positive integer.

The first word line $WL_1$ is for receiving a first word line signal $SWL_1$, and the first select gate line $SG_1$ is for receiving a first select gate signal $SSG_1$. The first control line $CL_1$ is for receiving a first control line signal $SCL_1$, and the first erase line $EL_1$ is for receiving a first erase line signal $SEL_L$.

Each of the first memory cells $M1C_1$ to $M1C_N$ includes a word line node, a select gate, a control node, an erase node, a bit line node, and a source line node. The word line nodes of the first memory cells $M1C_1$ to $M1C_N$ are coupled to the first word line $WL_1$, the select gates of the first memory cells $M1C_1$ to $M1C_N$ are coupled to the first select gate line $SG_1$, the control nodes of the first memory cells $M1C_1$ to $M1C_N$ are coupled to the first control line $CL_1$, and the erase nodes of the first memory cells $M1C_1$ to $M1C_N$ are coupled to the first erase line $EL_1$.

The bit line nodes of the first memory cells $M1C_1$ to $M1C_N$ receive different bit line signals through different bit lines $BL_1$ to $BL_N$. That is, the bit line nodes of the first memory cells $M1C_1$ to $M1C_N$ may receive the bit line signals $SBL_1$ to $SBL_N$ respectively. Also, the source line nodes of the first memory cells $M1C_1$ to $M1C_N$ receive different source line signals through different source lines $SL_1$ to $SL_N$. That is, the source line nodes of the first memory cells $M1C_1$ to $M1C_N$ may receive the source line signals $SSL_1$ to $SSL_N$ respectively.

Figure 2:
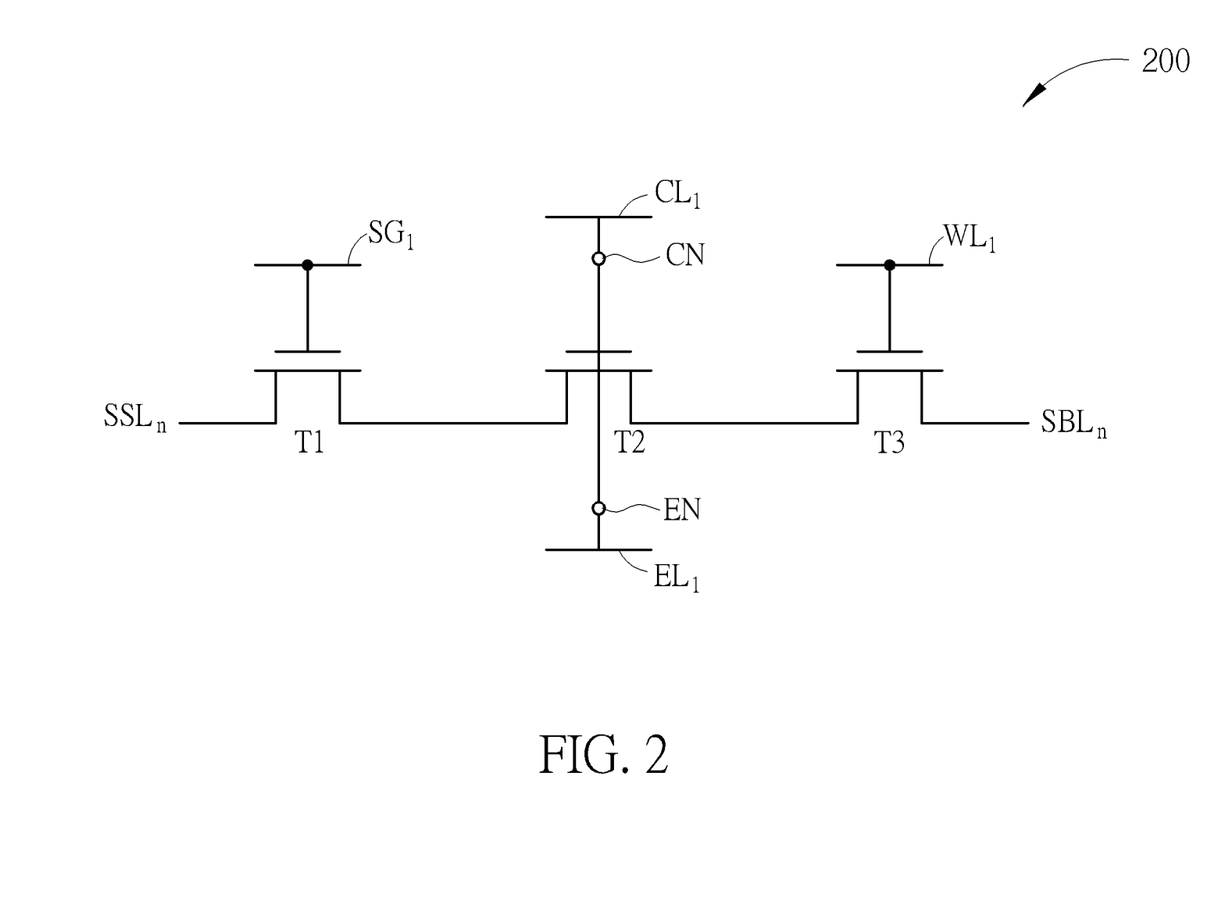
FIG. 2 shows the memory cell of the memory array in FIG. 1 according to one embodiment of the present invention.

FIG. 2 shows a memory cell 200 according to one embodiment of the present invention. The memory cell 200 includes a first select transistor T1, a floating gate transistor T2, and a second select transistor T3.

A connection node of the first select transistor T1 is coupled to a first connection node of the floating gate transistor T2, and the second connection node of the floating gate transistor T2 is coupled to a connection node of the second select transistor T3.

Furthermore, when using the memory cell 200 as a first memory cell, for example, the first memory cell $M1C_n$ (n is a positive integer no greater than N), in the first memory page MP1, a node of the first select transistor T1 can be the source line node of the first memory cell $M1C_n$ for receiving the source line signal $SSL_n$, a gate of the first select transistor T1 can be the select gate of the first memory cell $M1C_n$ coupled to the first select gate line $SG_1$. Also, a floating gate of the floating gate transistor T2 can be coupled to the control node CN of the first memory cell $M1C_n$ and further to the first control line $CL_1$, and can be coupled to the erase node EN of the first memory cell $M1C_n$ and further to the first erase line $EL_1$. A node of the second select transistor T3 can be the bit line node of the first memory cell $M1C_n$ for receiving the bit line signal $SBL_n$, and a gate of the second select transistor T3 can be the word line node of the first memory cell $M1C_n$ coupled to the first word line $WL_1$.

Table 1 shows voltages of the signals received by the first memory cell $M1C_n$ of the first memory cells $M1C_1$ to $M1C_N$ when the first memory cell $M1C_n$ is selected for different operations, where n is an integer between 1 and N. In Table 1, the first voltage VPP and the fourth voltage VEE are greater than the second voltage VDD, and the second voltage VDD is greater than the third voltage GND. The fourth voltage VEE may be at a same level as the first voltage VPP. The first voltage VPP may be, for example, from 5V to 20V. The second voltage VDD may be used as input/output voltage from/to other circuits for general purposes, and, for example, may be from 0V to 5V. The third voltage GND may be the ground voltage, 0V.

TABLE 1

| | $SCL_1$ | $SEL_1$ | $SSL_n$ | $SSG_1$ | $SWL_1$ | $SBL_n$ |
|---|---|---|---|---|---|---|
| Program (selected cell) | VPP | VEE | GND | VDD | VDD | GND |
| Program Inhibit (unselected cell) | VPP | VEE | VDD | VDD | VDD | VDD |
| Erase | GND | VEE | GND | VDD | VDD | GND |

During a program operation of the selected first memory cell $M1C_n$, the bit line signal $SBL_n$ received by the bit line node of the selected first memory cell $M1C_n$ is at the third voltage GND, and the source line signal $SSL_n$ received by the source line node of the selected first memory cell $M1C_n$ is at the third voltage GND. Also, the first word line signal $SWL_1$ is at the second voltage VDD, the first select gate signal $SSG_1$ is at the second voltage VDD, the first control line signal $SCL_1$ is at the first voltage VPP, and the first erase line signal $SEL_1$ is at the fourth voltage VEE. Since the first control line signal $SCL_1$ and the first erase line signal $SEL_1$ are at the greater voltages VPP and VEE respectively, the FN electron tunneling injection may occur to the floating gate transistor T2 of the selected first memory cell $M1C_n$ so that the first memory cell $M1C_n$ can store/retain electrons while being programmed.

During an erase operation of the first memory cell $M1C_n$, the same voltages of the signals in the programming operation can be applied, except for the first control line signal $SCL_1$ and the first erase line signal $SEL_L$. During the erase operation of the selected first memory cell $M1C_n$, the first control line signal $SCL_1$ is at the third voltage GND and the erase line signal $SEL_1$ is at the fourth voltage VEE so the electrons stored/retained by the floating gate of the first memory cell $M1C_n$ will be ejected and the first memory cell $M1C_n$ can be erased. The fourth voltage VEE can be same as the first voltage VPP or can be different from the first voltage VPP, depending on the system requirements.

However, the first memory cells $M1C_1$ to $M1C_N$ in the first memory page MP1 are all coupled to the first word line $WL_1$, the first select gate line $SG_1$, the first control line $CL_1$, and the first erase line $EL_1$, therefore, the bit line signal $SBL_n$ and the source line signal $SSL_n$ received by the first memory cell $M1C_n$ may be used to ensure that the first memory cell $M1C_n$ is to be program inhibited while the selected first memory cell other than the first memory cell $M1C_n$ in the first memory page MP1 is being programmed. To program inhibit the unselected first memory cell $M1C_n$ during a programming operation of the selected first memory cell, the bit line signal received by the selected first memory cell and the bit line signal $SBL_n$ received by an unselected first memory cell $M1C_n$ can be at different voltages, and the source line signal received by the selected first memory cell and the source line signal $SSL_n$ received by the unselected first memory cell $M1C_n$ can be at different voltages.

For example, when the first memory cell $M1C_1$ is selected to be programmed, namely, during a program operation of the selected first memory cell $M1C_1$, the first memory cell $M1C_n$ is under an program inhibit operation. In this case, the first control line signal $SCL_1$ is at the first voltage VPP and the first erase line signal $SEL_1$ is at the fourth voltage VEE, the first word line signal $SWL_1$ is at the second voltage VDD, the first select gate signal $SSG_1$ is at the second voltage VDD, the bit line signal $SBL_1$ received by the bit line node of the selected first memory cell $M1C_1$ is at the third voltage GND, and the source line signal $SSL_1$ received by the source line node of the selected first memory cell $M1C_1$ is at the third voltage GND so that the selected first memory cell $M1C_1$ can be programmed.

However, the bit line signal $SBL_n$ received by the bit line node of the unselected first memory cell $M1C_n$ is at the second voltage VDD, and the source line signal $SSL_n$ received by the source line node of the unselected first memory cell $M1C_n$ is at the second voltage VDD.

Since the bit line signal $SBL_n$ and the source line signal $SSL_n$ are both at the second voltage VDD as the first word line signal $SWL_1$ and the first select gate signal $SSG_1$, the select transistors T1 and T3 in the first memory cell $M1C_n$ can be turned on. The second voltage VDD therefore passes to both the first connection node and the second connection node of the floating gate transistor T2 of the first memory cell $M1C_n$ which results in that the first memory cell $M1C_n$ is program inhibited (because the bias condition of the floating gate transistor T2 is unable to induce sufficient F-N program mechanism) during the program operation of the selected first memory cell $M1C_1$ in the first memory page MP1.

In prior art, when one memory page is selected, all memory cells in the selected memory page will be programmed or erased simultaneously. That is, the memory array of prior art is not able to program the memory cells in the same memory page individually. However, according to the memory array 100, the first memory cells $M1C_1$ to $M1C_N$ of the first memory page MP1 can be operated properly and individually with the shared first word line $WL_1$, select gate line $SG_1$, control line $CL_1$ and erase line $EL_1$, and with different bit line signals and source line signals. However, if required, the first memory cells $M1C_1$ to $M1C_N$ of the first memory page MP1 can, of course, be operated simultaneously as well.

Therefore, the flexibility of memory operation to the memory array 100 can be achieved in an efficient way by sharing common signal lines.

Also, in addition to the memory cell 200, the first memory cells $M1C_1$ to $M1C_N$ may also adopt other types of memory cell as long as the adopted memory cell can be operated properly with similar control signals shown in Table 1.

Figure 3:
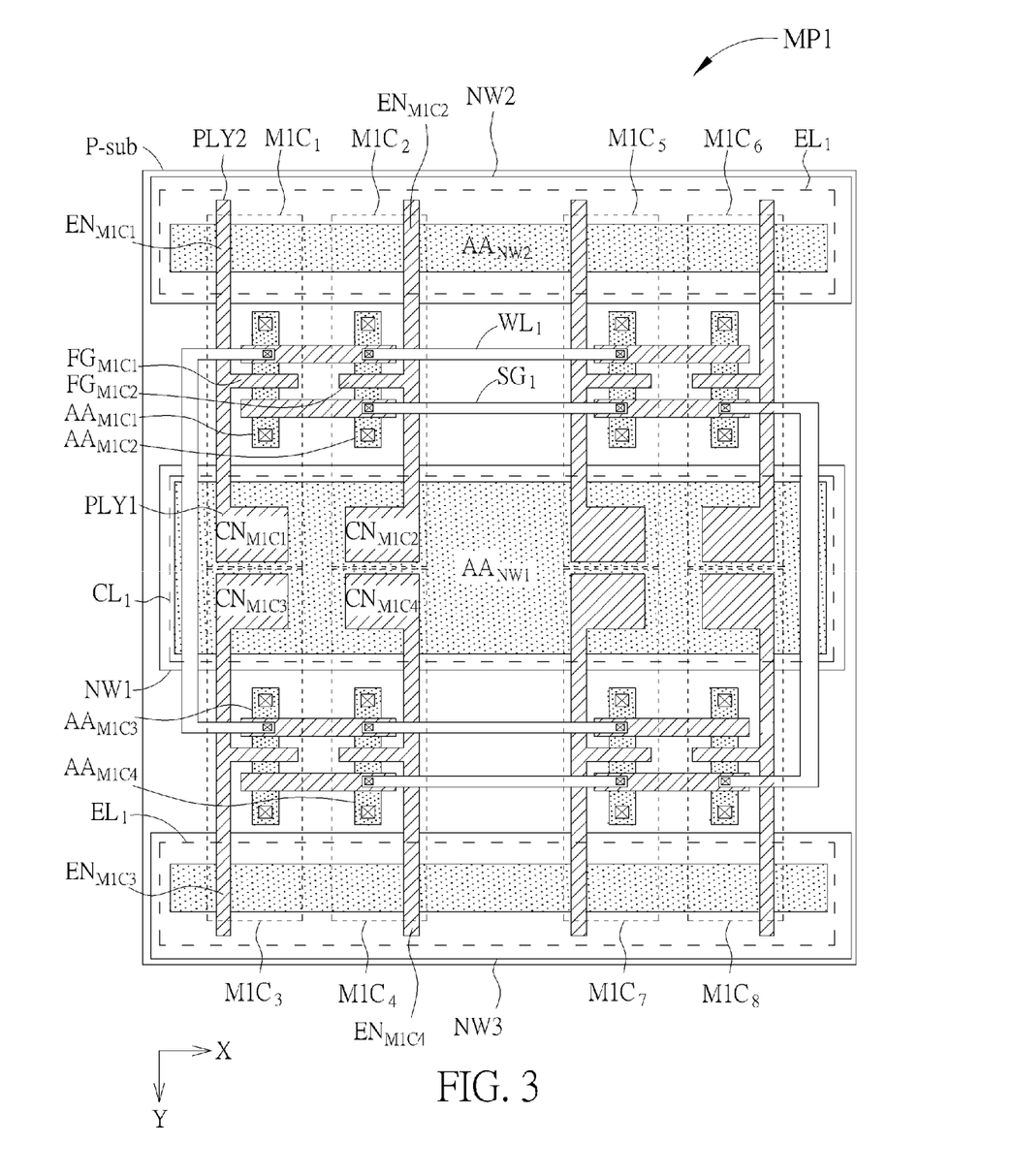
FIG. 3 shows a top view of the layout of a memory page of the memory array in FIG. 1 according to one embodiment of the present invention.

FIG. 3 shows a top view of the layout of the first memory page MP1 according to one embodiment of the present invention. In FIG. 3, the first memory page MP1 includes the first memory cell $M1C_1$ and $M1C_2$, and each of the first memory cell $M1C_1$ and $M1C_2$ may have the same structure as the memory cell 200.

In FIG. 3, the first control line $CL_1$ can be disposed in a first well NW1, and the first erase line $EL_1$ can be disposed in a second well NW2. The first well NW1 and the second well NW2 are N-type wells disposed in a P-type substrate P-sub. In some embodiments, the P-type substrate P-sub is coupled to the third voltage GND. Control nodes $CN_{M1C1}$ and $CN_{M1C2}$ of the first memory cells $M1C_1$ and $M1C_2$ are disposed on the first well NW1 above the first control line $CL_1$, and erase nodes $EN_{M1C1}$ and $EN_{M1C2}$ of the first memory cells $M1C_1$ and $M1C_2$ are disposed on the second well NW2 above the first erase line $EL_1$.

In some embodiments of the present invention, the first control line $CL_1$ can be formed in an active region $AA_{NW1}$ in the first well NW1, and the control nodes $CN_{M1C1}$ and $CN_{M1C2}$ can be formed by a pattern of polysilicon PLY1 above the active region $AA_{NW1}$ in the first well NW1. The first erase line $EL_1$ can also be formed in an active region $AA_{NW2}$ in the second well NW2, and the erase nodes $EN_{M1C1}$ and $EN_{M1C2}$ can be formed by a pattern of polysilicon PLY2 above the active region $AA_{NW2}$ in the second well NW2. In this case, the first control line $CL_1$ and the control nodes $CN_{M1C1}$ and $CN_{M1C2}$ can behave as capacitors, and the first erase line $EL_1$ and the erase nodes $EN_{M1C1}$ and $EN_{M1C2}$ can also behave as capacitors. The control line signal $SCL_1$ and the erase line signal $SEL_L$ can be directly applied to the first well NW1 and the second well NW2 respectively, and the control line signal $SCL_1$ and the erase line signal $SEL_1$ will be coupled to the control nodes $CN_{M1C1}$ and $CN_{M1C2}$ and the erase nodes $EN_{M1C1}$ and $EN_{M1C2}$ through the capacitors.

Also, in FIG. 3, rest part of the first memory cell $M1C_1$ and $M1C_2$ are disposed along a direction X and disposed in active regions $AA_{M1C1}$ and $AA_{M1C2}$ between the first well NW1 and the second well NW2. Thus, the floating gate $FG_{M1C1}$ of the first memory cell $M1C_1$ and the floating gate $FG_{M1C2}$ of the first memory cell $M1C_2$ are crossing the first well NW1 and the second well NW2 for coupling to the control nodes $CN_{M1C1}$ and $CN_{M1C2}$ and the erase nodes $EN_{M1C1}$ and $EN_{M1C2}$.

In some embodiments of the present invention, the first memory page MP1 may include even more first memory cells along the direction X disposed between the first well NW1 and the second well NW2. However, due to the limited circuit space of the system, the first memory cells may not be able to be disposed all in the same direction X. Therefore, in FIG. 3, the first erase line $EL_1$ can further be disposed in a third well NW3, which can also be an N-type well. That is, the erase line signal $SEL_1$ can be directly applied to both the third well NW3 and the second well NW2 simultaneously.

In this case, control nodes $CN_{M1C3}$ and $CN_{M1C4}$ of the first memory cell $M1C_3$ and $M1C_4$ are disposed on the first well NW1 above the first control line $CL_1$, and erase nodes $EN_{M1C1}$ and $EN_{M1C2}$ are disposed on the third well NW3 above the first erase line $EL_1$. The rest part of the first memory cell $M1C_3$ and $M1C_4$ are disposed in active regions $AA_{M1C3}$ and $AA_{M1C4}$ between the first well NW1 and the third well NW3. Thus, the floating gate $FG_{M1C3}$ of the first memory cell $M1C_3$ and the floating gate $FG_{M1C4}$ of the first memory cell $M1C_4$ are crossing the first well NW1 and the third well NW3. Consequently, the first memory cells $M1C_1$ and $M1C_3$ can be disposed along a direction Y. In addition, by sharing the same first well NW1, the first memory page MP1 can use the limited circuit area even more efficiently.

Of course, in some embodiments of the present invention, the first memory page MP1 may dispose more first memory cells M1C$_5$ and M1C$_6$ along the direction X, or more first memory cells M1C$_7$ and M1C$_8$ along the direction Y.

In addition, the first word line nodes of the first memory cell M1C$_1$ to M1C$_8$, ex., the gates of the second select transistors of first memory cell M1C$_1$ to M1C$_8$, can be coupled together to the first word line WL$_1$ through metal layers or shared polysilicon layers, and the first select gates of the first memory cell M1C$_1$ to M1C$_8$ can be coupled together to the first select gate line SG$_1$ through metal layers or shared polysilicon layers.

Figure 4:
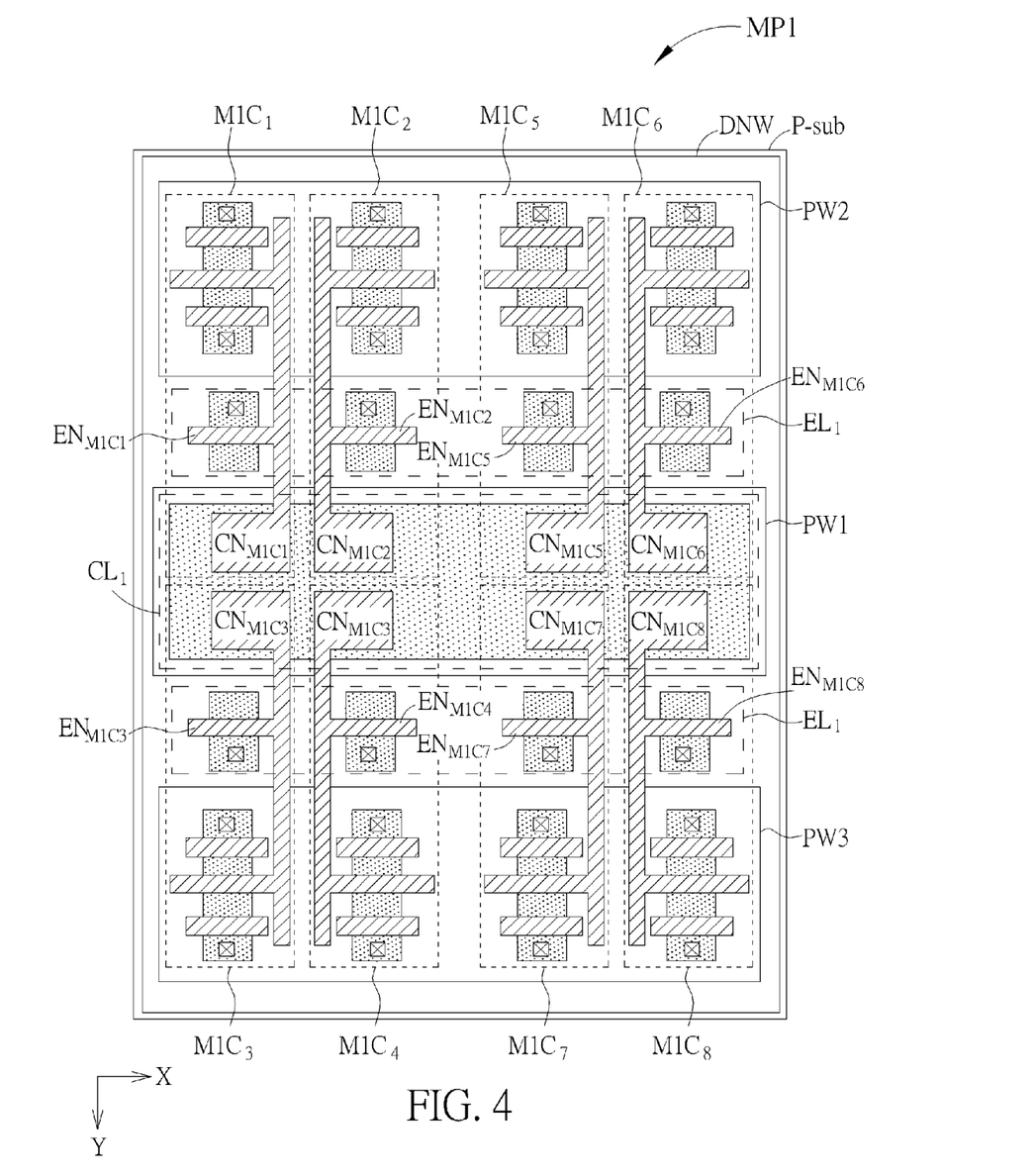
FIG. 4 shows a top view of the layout of a memory page of the memory array in FIG. 1 according to another embodiment of the present invention.

Although in FIG. 3, the first control line CL$_1$ and the first erase line EL$_1$ are disposed in N-type wells, the first control line CL$_1$ and the first erase line EL$_1$ may also be disposed in different types of wells. FIG. 4 shows another top view of the first memory page MP1 according to one embodiment of the present invention. In FIG. 4, the first memory page MP1 includes the first memory cell M1C$_1$ to M1C$_8$, and each of the first memory cell M1C$_1$ to M1C$_8$ may have the same structure as the memory cell 200.

In FIG. 4, the first control line CL$_1$ is disposed in a first well PW1, and the control nodes CN$_{M1C1}$, CN$_{M1C2}$, CN$_{M1C5}$ and CN$_{M1C6}$ of the first memory cells M1C$_1$, M1C$_2$, M1C$_5$ and M1C$_6$ are disposed on the first well PW1 above the first control line CL$_1$. Part of the first memory cells M1C$_1$, M1C$_2$, M1C$_5$ and M1C$_6$ are disposed in a second well PW2, the first erase line EL$_1$ is disposed between the first well PW1 and the second well PW2, and the erase nodes EN$_{M1C1}$, EN$_{M1C2}$, EN$_{M1C5}$ and EN$_{M1C6}$ of the first memory cells M1C$_1$, M1C$_2$, M1C$_5$ and M1C$_6$ are disposed between the first well PW1 and the second well PW2 above the first erase line EL$_1$. Part of the first memory cells M1C$_3$, M1C$_4$, M1C$_7$ and M1C$_8$ are disposed in a third well PW3, the first erase line EL$_1$ is further disposed between the first well PW1 and the third well PW3, and the erase nodes EN$_{M1C3}$, EN$_{M1C4}$, EN$_{M1C7}$ and EN$_{M1C8}$ of the first memory cells M1C$_3$, M1C$_4$, M1C$_7$ and M1C$_8$ are disposed between the first well PW1 and the third well PW3 above the first erase line EL$_1$. The first well PW1, the second well PW2, and the third well PW3 are P-type wells disposed in a deep N-type well DNW disposed in a P-type substrate P-sub.

In this case, the first erase line EL$_1$ can be disposed in active regions between the first well PW1 and the second well PW2 and between the first well PW1 and the third well PW3.

Furthermore, in some cases, a reading current generated by a single first memory cell may be rather small, which may cause the long read time of the first memory page MP1. To solve this issue, bit line nodes of K first memory cells in the first memory page MP1 can be coupled together and source line nodes of the K first memory cells in the first memory page MP1 can be coupled together, K is an integer greater than 1.

Figure 5:
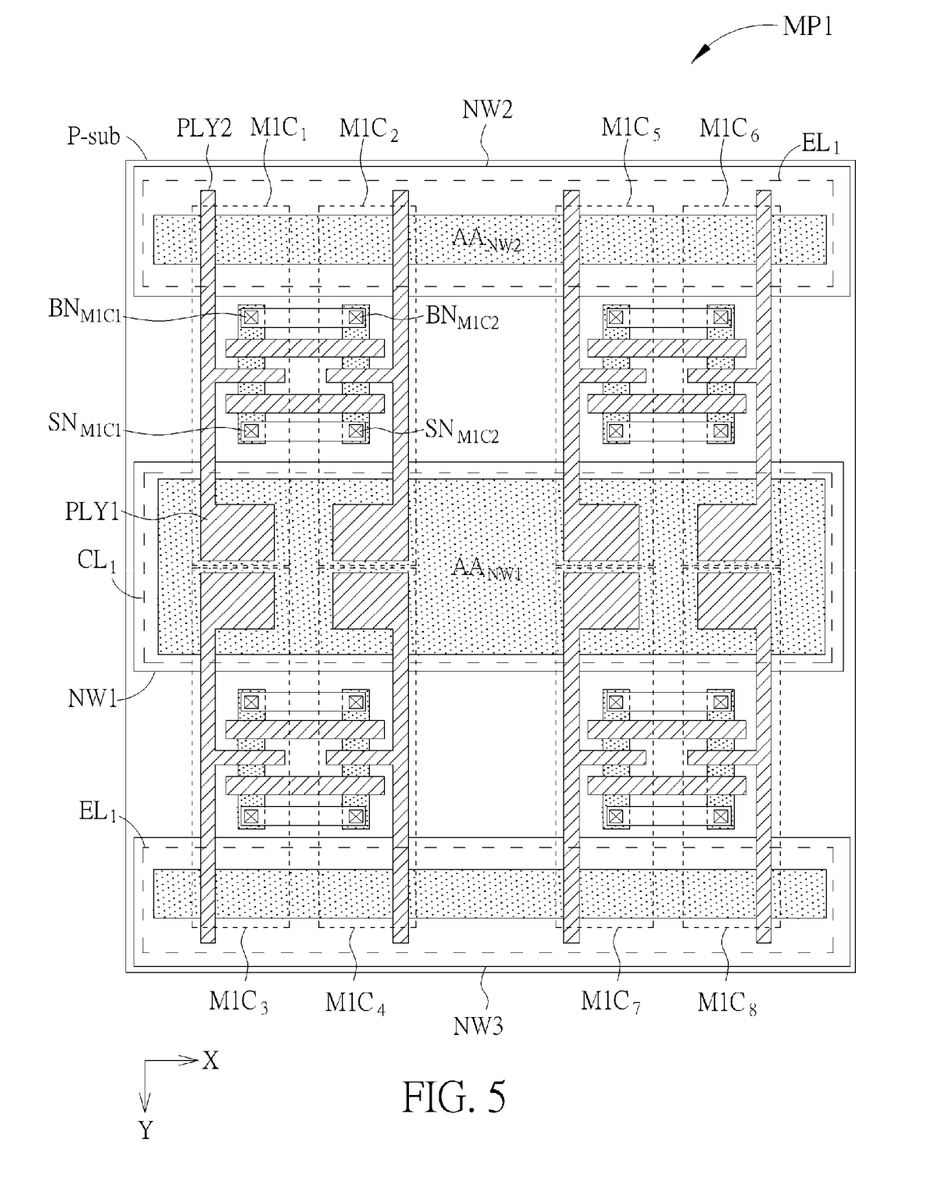
FIG. 5 shows a top view of the layout of a memory page of the memory array in FIG. 1 according to another embodiment of the present invention.

FIG. 5 shows another top view the first memory page MP1 according to one embodiment of the present invention. In FIG. 5, the first memory page MP1 has the similar layout as shown in FIG. 3, however, two bit line nodes BN$_{M1C1}$ and BN$_{M1C2}$ of the first memory cells M1C$_1$ and M1C$_2$ are coupled together and two source line nodes SN$_{M1C1}$ and SN$_{M1C2}$ of the first memory cells M1C$_1$ and M1C$_2$ are coupled together.

In this case, the first memory cells M1C$_1$ and M1C$_2$ are operated consistently, that is, the first memory cells M1C$_1$ and M1C$_2$ will be programmed, erased, and read simultaneously so that reading currents of the first memory cells M1C$_1$ and M1C$_2$ can be combined together to identify the information stored. Since the combined reading current has a greater value than a single reading current, the combined reading current can help to reduce the read time of the first memory page MP1.

Although in FIG. 5, the bit line nodes BN$_{M1C1}$ and BN$_{M1C2}$ of the first memory cells M1C$_1$ and M1C$_2$ are coupled together through metal layer within the first memory page MP1 and source line nodes SN$_{M1C1}$ and SN$_{M1C2}$ of the first memory cells M1C$_1$ and M1C$_2$ are coupled together through metal layer within the first memory page MP1 for saving external wiring, in other embodiments of the present invention, the bit line nodes of the first memory cells M1C$_1$ and M1C$_2$ may also receive the same signal from outside of the first memory page MP1 and source line nodes of the first memory cells M1C$_1$ and M1C$_2$ may receive same the signal from outside of the first memory page MP1.

Figure 6:
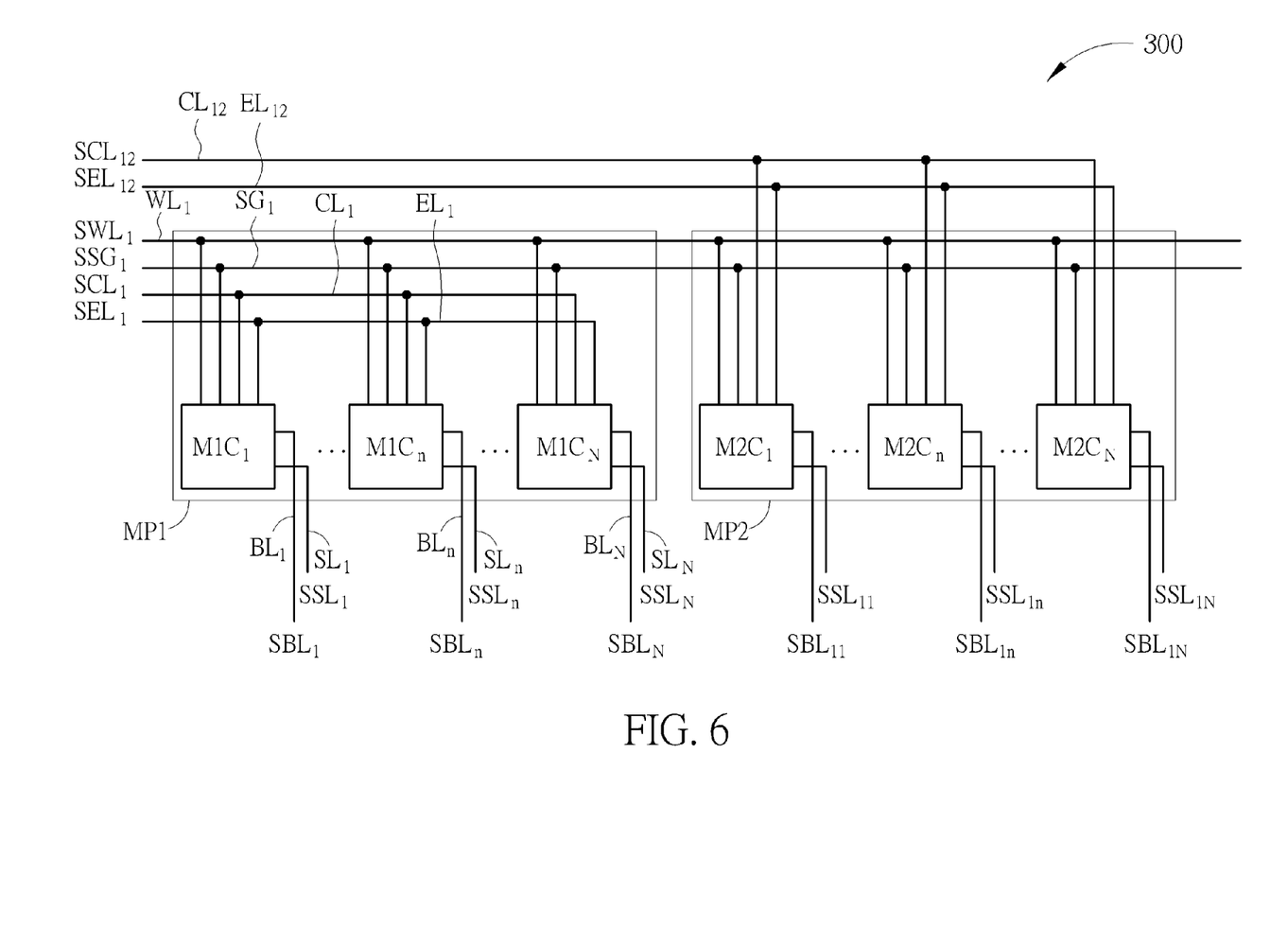
FIG. 6 shows a memory array according to another embodiment of the present invention.

Furthermore, in FIG. 1, the memory array 100 includes the first memory page MP1, but in some other embodiments of the present invention, the memory array 100 may further include more memory pages for storing more information in different pages. FIG. 6 shows a memory array 300 according to one embodiment of the present invention. The memory array 300 includes a first memory page MP1 and a second memory page MP2.

The second memory page MP2 has a similar structure as the first memory page MP1, but may receive different signals. The second memory page MP2 includes a second control line CL$_{12}$, a second erase line EL$_{12}$, and a plurality of second memory cells M2C$_1$ to M2C$_N$.

The second control line CL$_{12}$ is for receiving a second control line signal SCL$_{12}$, and the second erase line EL$_{12}$ is for receiving a second erase line signal SEL$_{12}$.

Each of the second memory cells M2C$_1$ to M2C$_N$ includes a word line node, a select gate, a control node, an erase node, a bit line node, and a source line node. The word line nodes of the second memory cells M2C$_1$ to M2C$_N$ are coupled to the first word line WL$_1$, and the select gates of the second memory cells M2C$_1$ to M2C$_N$ are coupled to the first select gate line SG$_1$. The control nodes of the second memory cells M2C$_1$ to M2C$_N$ are coupled to the second control line CL$_{12}$, and the erase nodes of the second memory cells M2C$_1$ to M2C$_N$ are coupled to the second erase line EL$_{12}$. The bit line nodes of the second memory cells M2C$_1$ to M2C$_N$ are for receiving different bit line signals SBL$_{11}$ to SBL$_{1N}$, and the source line nodes the second memory cells M2C$_1$ to M2C$_N$ are for receiving different source line signals SSL$_{11}$ to SSL$_{1N}$.

That is, the first memory page MP1 and the second memory page MP2 can share the same word line signal SWL$_1$ and the same select gate signal SSG$_1$. However, since the first memory page MP1 and the second memory page MP2 are coupled to different control lines CL$_1$ and CL$_{12}$, and different erase lines EL$_1$ and EL$_{12}$, the second memory cells M2C$_1$ to M2C$_N$ in the second memory page MP2 can still be operated properly with the signals shown in Table 1.

For example, during a programming operation of a second memory cell M2C$_n$ in the second memory page MP2, the first word line signal SWL$_1$ and the first select gate signal SSG$_1$ are at the second voltage VDD, the source line signal and the bit line signal received by the second memory cell M2C$_n$ are at the third voltage GND, and the second control line signal SCL$_{12}$ and the second erase line signal SEL$_{12}$ are at the first voltage VPP and the fourth voltage VEE respectively so the selected second memory cell M2C$_n$ can be programmed. However, since the first memory page MP1 is unselected during the programming operation of the second memory cell M2C$_n$ in the second memory page MP2, the first control line signal $SCL_1$ and the first erase line signal $SEL_L$ can be at the third voltage GND so the unselected first memory cells $M1C_1$ to $M1C_N$ will not be programmed even with the first word line signal $SWL_1$ and the first select gate signal $SSG_1$ being at the second voltage VDD. Also, in this case, the source line signal $SSL_n$ and the bit line signal $SBL_n$ can be at the second voltage VDD or the third voltage GND.

Similarly, when the second memory page MP2 is selected and the first memory page MP1 is unselected during an erase operation, the first erase line signal $SEL_1$ can be at the third voltage GND while the second erase line signal $SEL_{12}$ can be at the fourth voltage VEE so the unselected first memory cells $M1C_1$ to $M1C_N$ will not be erased during the erase operation of a second memory cell in the second memory page MP2.

Therefore, the memory array 300 can arrange the memory page in an efficient way by sharing signal lines while preserving the flexibility of memory operations. Also, in some embodiments of the present invention, the memory array 300 may include even more memory pages with similar connections as the second memory page MP2 according to the system requirement.

Figure 7:
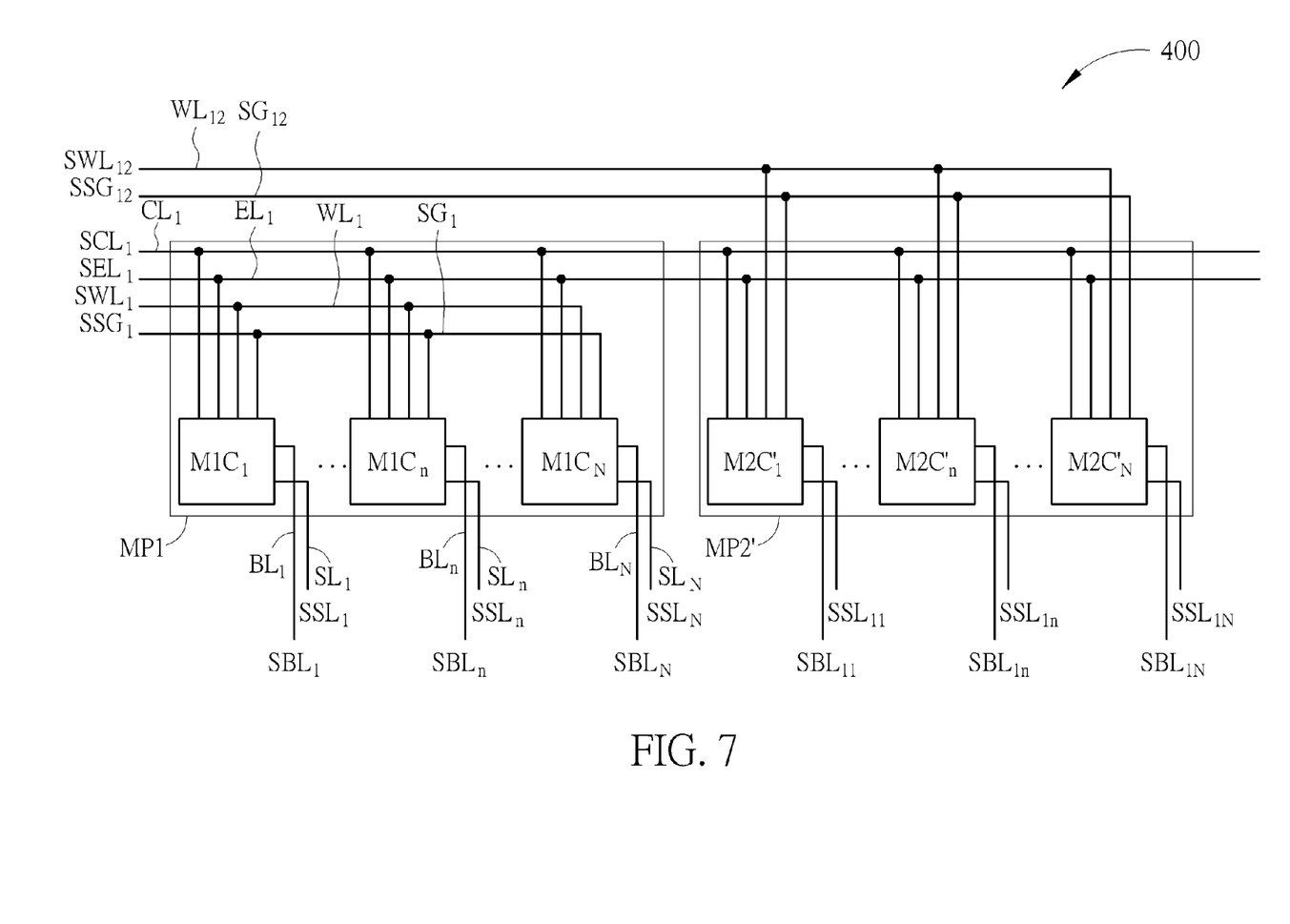
FIG. 7 shows a memory array according to another embodiment of the present invention.

FIG. 7 shows a memory array 400 according to one embodiment of the present invention. The memory array 400 includes a first memory page MP1 and a second memory page MP2'. The second memory page MP2' in FIG. 7 is similar to the second memory page MP2 in FIG. 6. However, the second memory page MP2' includes a second word line $WL_{12}$, a second select gate line $SG_{12}$, and a plurality of second memory cells $M2C'_1$ to $M2C'_N$.

The second word line $WL_{12}$ is for receiving a second word line signal $SWL_{12}$, and the second select gate line $SG_{12}$ is for receiving a second select gate signal $SSG_{12}$.

Each of the plurality of second memory cells $M2C'_1$ to $M2C'_N$ includes a word line node, a select gate, a control node, an erase node, a bit line node, and a source line node. The word line nodes of the second memory cells $M2C'_1$ to $M2C'_N$ are coupled to the second word line $WL_{12}$, and the select gates of the second memory cells $M2C'_1$ to $M2C'_N$ are coupled to the second select gate line $SG_{12}$. The control nodes of the second memory cells $M2C'_1$ to $M2C'_N$ are coupled to the first control line $CL_1$, and the erase nodes of the second memory cells $M2C'_1$ to $M2C'_N$ are coupled to the first erase line $EL_1$. The bit line nodes of the second memory cells $M2C'_1$ to $M2C'_N$ are for receiving different bit line signals $SBL_{11}$ to $SBL_{1N}$, and the source line nodes the second memory cells $M2C'_1$ to $M2C'_N$ are for receiving different source line signals $SSL_{11}$ to $SSL_{1N}$.

That is, the first memory page MP1 and the second memory page MP2' can share the same control line $CL_1$ and the same erase line $EL_1$. However, since the first memory page MP1 and the second memory page MP2' are coupled to different word lines $WL_1$ and $WL_{12}$ and different select gate lines $SG_1$ and $SG_{12}$, the second memory cells $M2C'_1$ to $M2C'_N$ in the second memory page MP2' can still be operated properly with the signals shown in Table 1.

For example, during a programming operation of the second memory cell $M2C'_n$ in the second memory page MP2, the source line signal and the bit line signal received by the second memory cell $M2C'_n$ can be at the third voltage GND, the first control line signal $SCL_1$ and the first erase line signal $SEL_1$ can be at the first voltage VPP and the fourth voltage VEE respectively, and the second word line signal $SWL_{12}$ and the second select gate signal $SSG_{12}$ can be at the second voltage VDD so the second memory cell $M2C'_n$ can be programmed. However, since the first memory page MP1 is unselected during the programming operation of the second memory cell $M2C'_n$ in the second memory page MP2, the source line signal and the first select gate signal received by the first memory cells $M1C_1$ to $M1C_N$, the first word line signal $SWL_1$, and the bit line signal $SBL_n$ can be all at the third voltage GND or all at the second voltage VDD so the unselected first memory cells $M1C_1$ to $M1C_N$ will not be programmed even with the first control line signal $SCL_1$ and the first erase line signal $SEL_L$ being at the first voltage VPP and the fourth voltage VEE respectively. Namely, in this case, the select transistors of the first memory cells $M1C_1$ to $M1C_N$ can be turned off so the first memory cells $M1C_1$ to $M1C_N$ will not be programmed.

In FIG. 6, the first memory page MP1 and the second memory page MP2 are disposed along the direction X, however, in some embodiments, the memory array may include other memory pages disposed along the direction Y with respect to the first memory page MP1.

Figure 8:
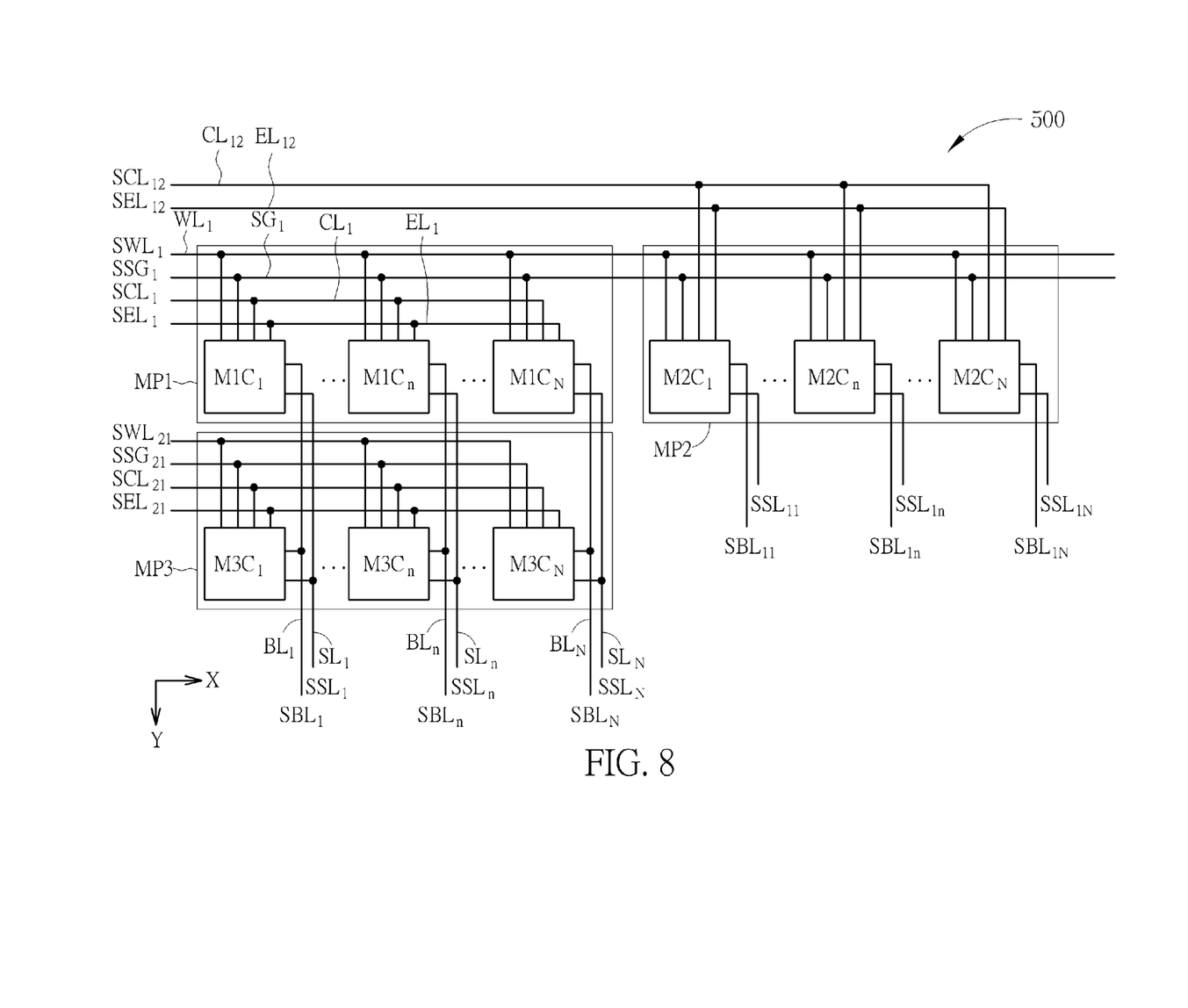
FIG. 8 shows a memory array according to another embodiment of the present invention.

FIG. 8 shows a memory array 500 according to one embodiment of the present invention. The memory array 500 includes a first memory page MP1, a second memory page MP2, and a third memory page MP3. The first memory page MP1 and the second memory page MP2 are disposed along the direction X. The first memory page MP1 and the third memory page MP3 are disposed along the direction Y.

The third memory page MP3 includes a third word line $WL_{21}$, a third select gate line $SG_{21}$, a third control line $CL_{21}$, a third erase line $EL_{21}$, and a plurality of third memory cells $M3C_1$ to $M3C_N$.

The third word line $WL_{21}$ is for receiving a third word line signal $SWL_{21}$, and third select gate line $SG_{21}$ is for receiving a third select gate signal $SSG_{21}$. The third control line $CL_{21}$ is for receiving receive a third control line signal $SCL_{21}$, and the third erase line $EL_{21}$ is for receiving a third erase line signal $SEL_{21}$. Each of the plurality of third memory cells $M3C_1$ to $M3C_N$ includes a word line node, a select gate, a control node, an erase node, a bit line node, and a source line node. The word line nodes of the third memory cells $M3C_1$ to $M3C_N$ are coupled to the third word line $WL_{21}$, and the select gates of the third memory cells $M3C_1$ to $M3C_N$ are coupled to the third select gate line $SG_{21}$. The control nodes of the third memory cells $M3C_1$ to $M3C_N$ are coupled to the third control line $CL_{21}$, and the erase nodes of the third memory cells $M3C_1$ to $M3C_N$ are coupled to the third erase line $EL_{21}$. The bit line nodes of the third memory cells $M3C_1$ to $M3C_N$ are coupled to bit line nodes of corresponding first memory cells $M1C_1$ to $M1C_N$ in the first memory page MP1 for receiving corresponding bit line signals $SBL_1$ to $SBL_N$, and the source line nodes of the third memory cells $M3C_1$ to $M3C_N$ are coupled to source line nodes of corresponding first memory cells $M1C_1$ to $M1C_N$ in the first memory page MP1 for receiving the corresponding source line signals $SSL_1$ to $SSL_N$.

Since the first memory cells $M1C_1$ to $M1C_N$ and the third memory cells $M3C_1$ to $M3C_N$ receive different control line signals $SCL_1$ and $SCL_{21}$, different erase line signal $SEL_1$ and $SEL_{21}$, different word line signals $SWL_1$ and $SWL_{21}$, and different select gate signals $SSG_1$ and $SSG_{21}$, the third memory cells $M3C_1$ to $M3C_N$ can receive the same bit line signals $SBL_1$ to $SBL_N$ and the same source line signals $SSL_1$ to $SSL_N$ as the first memory cells $M1C_1$ to $M1C_N$ without being interfered by the operations of the first memory cells $M1C_1$ to $M1C_N$.

Table 2 shows voltages of the signals received by the first memory cell $M1C_n$ of the first memory cells $M1C_1$ to $M1C_N$ when the first memory page MP1 is selected or unselected for different operations.

TABLE 2

|  | Page level | SCL$_1$ | SEL$_1$ | SSL$_n$ | SSG$_1$ | SWL$_1$ | SBL$_n$ |
| --- | --- | --- | --- | --- | --- | --- | --- |
| Program | selected | VPP | VEE | GND | VDD | VDD | GND |
|  | unselected | GND | — | — | — | — | — |
| Program Inhibit | selected | VPP | VEE | VDD | VDD | VDD | VDD |
|  | unselected | GND | — | — | — | — | — |
| Erase | selected | GND | VEE | — | — | — | — |
|  | unselected | GND | GND | — | — | — | — |

According to Table 2, when the first memory page MP1 is not selected, the first control line signal SCL$_1$ can be at the third voltage GND so that the memory cell M1C$_n$ in the unselected memory page MP1 will not be program. In this case, the first select gate signal SSG$_1$ and the first word line signal SWL$_1$ can be at any voltages, such as the second voltage VDD when the second memory page MP2 is selected. Also, the source line signal SSL$_n$, the bit line signal SBL$_n$, and the first erase line signal SEL$_1$, can be at any voltages, such as at the third voltage GND when the third memory page MP3 is selected. Moreover, in some embodiments, the fourth voltage VEE may be at a same level as the first voltage VPP.

For example, during a programming operation of the third memory cell M3C$_n$ in the third memory page MP3, i.e. the third memory page MP3 is selected, the third control line signal SCL$_{21}$ and the third erase line signal SEL$_{21}$ can be at the first voltage VPP and the fourth voltage VEE respectively, the third select gate signal SSG$_{21}$ and the third word line signal SWL$_{21}$ can be at the second voltage VDD, and the source line signal SSL$_n$ and the bit line signal SBL$_n$ can be at the third voltage GND so the third memory cell M3C$_n$ can be programmed. However, since the first memory page MP1 is unselected during the programming operation of the third memory cell M3C$_n$ in the third memory page MP3, the first control line signal SCL$_1$ can be at the third voltage GND so the unselected first memory cell M1C$_n$ will not be programmed.

In some embodiments of the present invention, more memory pages may be included in the memory array 500 along the direction X with respect to the first memory page MP1 and with signal connections similar to the second memory page MP2. That is, memory pages disposed along the direction X with respect to the first memory page MP1 will all be coupled to the first word line WL$_1$ and the first select gate line SG$_1$. Similarly, more memory pages may be included in the memory array 500 along the direction Y with respect to the first memory page MP1 and with signal connections similar to the third memory page MP3. That is, memory cells in the memory pages disposed along the direction Y with respect to the first memory page MP1 will receive the same bit line signal SBL$_1$ to SBL$_N$ and the same source line signal SSL$_1$ to SSL$_N$ as the corresponding first memory cells M1C$_1$ to M1C$_N$. Consequently, the memory array 500 is able to arrange even more memory pages disposed in different directions according to the system requirement.

In addition, since different memory pages in the memory array 500 can share some signal lines, the memory array 500 can use the limited circuit area efficiently while preserving the flexibility of memory operations.

Also, in some embodiments of the present invention, the memory array 500 may include the first memory page MP1 and the third memory page MP3 without the second memory page MP2 if the system has no sufficient space in the direction X.

In summary, the memory array provided by the embodiments of the present invention can arrange memory cells in different memory pages along different direction, and use the limited circuit area efficiently while preserving the flexibility of memory operations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory array, comprising:
a first memory page, comprising:
   a first word line configured to receive a first word line signal;
   a first select gate line configured to receive a first select gate signal;
   a first control line configured to receive a first control line signal;
   a first erase line configured to receive a first erase line signal; and
   a plurality of first memory cells each comprising:
      a word line node coupled to the first word line;
      a select gate coupled to the first select gate line;
      a control node coupled to the first control line;
      an erase node coupled to the first erase line;
      a bit line node configured to receive a bit line signal; and
      a source line node configured to receive a source line signal;
wherein:
bit line nodes of the plurality of first memory cells are configured to receive different bit line signals;
source line nodes of the plurality of first memory cells are configured to receive different source line signals; and
during an program operation of a selected first memory cell of the plurality of first memory cells, a bit line signal received by the selected first memory cell and a bit line signal received by an unselected first memory cell are at different voltages, and a source line signal received by the selected first memory cell and a source line signal received by the unselected first memory cell are at different voltages.

2. The memory array of claim 1, wherein:
during the program operation of the selected first memory cell, the first control line signal is at a first voltage, the first word line signal is at a second voltage, the first select gate signal is at the second voltage, the bit line signal received by the bit line node of the selected first memory cell is at a third voltage, the source line signal received by the source line node of the selected first memory cell is at the third voltage, and the first erase line signal is at a fourth voltage ; and
the first voltage and the fourth voltage are greater than the second voltage, and the second voltage is greater than the third voltage.

3. The memory array of claim 1, further comprising:
a second memory page, comprising:
   a second control line configured to receive a second control line signal;
   a second erase line configured to receive a second erase line signal; and
   a plurality of second memory cells each comprising:
      a word line node coupled to the first word line;
      a select gate coupled to the first select gate line;
      a control node coupled to the second control line;

an erase node coupled to the second erase line;
a bit line node configured to receive a bit line signal; and
a source line node configured to receive a source line signal.

4. The memory array of claim 1, further comprising:
a second memory page, comprising:
   a second word line configured to receive a second word line signal;
   a second select gate line configured to receive a second select gate signal; and
   a plurality of second memory cells each comprising:
      a word line node coupled to the second word line;
      a select gate coupled to the second select gate line;
      a control node coupled to the first control line;
      an erase node coupled to the first erase line;
      a bit line node configured to receive a bit line signal; and
      a source line node configured to receive a source line signal.

5. The memory array of claim 1, further comprising:
a third memory page, comprising:
   a third word line configured to receive a third word line signal;
   a third select gate line configured to receive a third select gate signal;
   a third control line configured to receive a third control line signal;
   a third erase line configured to receive a third erase line signal; and
   a plurality of third memory cells each comprising:
      a word line node coupled to the third word line;
      a select gate coupled to the third select gate line;
      a control node coupled to the third control line;
      an erase node coupled to the third erase line;
      a bit line node coupled to a bit line node of a corresponding first memory cell in the first memory page; and
      a source line node coupled to a source line node of the corresponding first memory cell in the first memory page.

6. The memory array of claim 1, wherein bit line nodes of K first memory cells in the first memory page are coupled together and source line nodes of the K first memory cells in the first memory page are coupled together, K is an integer greater than 1.

7. The memory array of claim 1, wherein the first memory cell further comprises:
   a first select transistor having the source line node, a connection node, and the select gate;
   a floating gate transistor having a first connection node coupled to the connection node of the first select transistor, a second connection node, and a floating gate coupled to the control node and the erase node; and
   a second select transistor having a connection node coupled to the second connection node of the floating gate transistor, the bit line node, and the word line node.

8. The memory array of claim 1, wherein:
control nodes of the plurality of first memory cells are disposed on a first well, erase nodes of the plurality of first memory cells are disposed at least on a second well, and rest part of the plurality of first memory cells are disposed at least between the first well and the second well.

9. The memory array of claim 8, wherein:
the erase nodes of the plurality of first memory cells are disposed on the second well and a third well, and the rest part of the plurality of first memory cells are disposed between the first well and the second well and between the first well and the third well.

10. The memory array of claim 1, wherein:
control nodes of the plurality of first memory cells are disposed on a first well, part of the plurality of first memory cells are disposed at least in a second well, and erase nodes of the plurality of first memory cells are disposed at least between the first well and the second well.

11. The memory array of claim 10, wherein:
the part of the plurality of first memory cells are disposed in the second well and a third well, and the erase nodes of the plurality of first memory cells are disposed between the first well and the second well and between the first well and the third well.

12. A memory array, comprising:
a first memory page, comprising:
   a first word line configured to receive a first word line signal;
   a first select gate line configured to receive a first select gate signal;
   a first control line configured to receive a first control line signal;
   a first erase line configured to receive a first erase line signal; and
   a plurality of first memory cells each coupled to the first word line, the first select gate line, the first control line, and the first erase line, and configured to receive a bit line signal and a source line signal; and
a second memory page, comprising:
   a second control line configured to receive a second control line signal;
   a second erase line configured to receive a second erase line signal; and
   a plurality of second memory cells each coupled to the first word line, the first select gate line, the second control line, and the second erase line, and configured to receive a bit line signal and a source line signal.

13. The memory array of claim 12, wherein:
during an program operation of a selected first memory cell of the plurality of first memory cells, a bit line signal received by the selected first memory cell and a bit line signal received by an unselected first memory cell are at different voltages, and a source line signal received by the selected first memory cell and a source line signal received by the unselected first memory cell are at different voltages.

14. The memory array of claim 12, further comprising:
a third memory page, comprising:
   a third word line configured to receive a third word line signal;
   a third select gate line configured to receive a third select gate signal;
   a third control line configured to receive a third control line signal;
   a third erase line configured to receive a third erase line signal; and
   a plurality of third memory cells each coupled to the third word line, the third select gate line, the third control line, the third erase line, a bit line node of a corresponding first memory cell in the first memory page, and a source line node of the corresponding first memory cell in the first memory page.

15. A memory array, comprising:
a first memory page, comprising:
- a first word line, configured to receive a first word line signal;
- a first select gate line configured to receive a first select gate signal;
- a first control line configured to receive a first control line signal;
- a first erase line configured to receive a first erase line signal; and
- a plurality of first memory cells each coupled to the first word line, the first select gate line, the first control line, and the first erase line, and configured to receive a bit line signal and a source line signal; and a second memory page, comprising:
- a second word line configured to receive a second word line signal;
- a second select gate line configured to receive a second select gate signal;
- a second control line configured to receive a second control line signal;
- a second erase line configured to receive a second erase line signal; and
- a plurality of second memory cells each coupled to the second word line, the second select gate line, the second control line, the second erase line, a bit line node of a corresponding first memory cell in the first memory page, and a source line node of the corresponding first memory cell in the first memory page.

* * * * *